(12) United States Patent
Wu et al.

(10) Patent No.: US 9,397,190 B2
(45) Date of Patent: Jul. 19, 2016

(54) FABRICATION METHOD OF SEMICONDUCTOR STRUCTURE

(71) Applicant: UNITED MICROELECTRONICS CORP., Hsin-Chu (TW)

(72) Inventors: Yen-Liang Wu, Taipei (TW); Chung-Fu Chang, Tainan (TW); Yu-Hsiang Hung, Tainan (TW); Ssu-I Fu, Kaohsiung (TW); Man-Ling Lu, Taoyuan County (TW); Chia-Jong Liu, Ping-Tung County (TW); Wen-Jiun Shen, Yunlin County (TW); Yi-Wei Chen, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 61 days.

(21) Appl. No.: 14/341,838

(22) Filed: Jul. 27, 2014

(65) Prior Publication Data

US 2015/0364568 A1 Dec. 17, 2015

(30) Foreign Application Priority Data

Jun. 11, 2014 (TW) .............................. 103120175 A

(51) Int. Cl.
*H01L 21/84* (2006.01)
*H01L 29/66* (2006.01)
*H01L 29/78* (2006.01)
*H01L 21/265* (2006.01)

(52) U.S. Cl.
CPC ........ *H01L 29/6656* (2013.01); *H01L 29/6659* (2013.01); *H01L 29/66636* (2013.01); *H01L 29/7834* (2013.01); *H01L 21/26586* (2013.01)

(58) Field of Classification Search
CPC .................. H01L 29/66545; H01L 29/66795; H01L 2924/00; H01L 29/6656; H01L 29/7848; H01L 29/785; H01L 29/66636; H01L 2924/0002; H01L 29/165; H01L 29/7833; H01L 29/6659; H01L 29/7834; H01L 21/28518
See application file for complete search history.

(56) References Cited

U.S. PATENT DOCUMENTS

| 8,487,354 B2 * | 7/2013 | Chen ................. H01L 21/31116 257/288 |
| 2008/0121985 A1 * | 5/2008 | Chen ............... H01L 21/823814 257/327 |

* cited by examiner

*Primary Examiner* — Robert Bachner
(74) *Attorney, Agent, or Firm* — Winston Hsu; Scott Margo

(57) ABSTRACT

A fabrication method of a semiconductor structure includes the following steps. First of all, a gate structure is provided on a substrate, and a first material layer is formed on the substrate and the gate structure. Next, boron dopant is implanted to the substrate, at two sides of the gate structure, to form a first doped region, and P type conductive dopant is implanted to the substrate, at the two sides of the gate structure, to form a second doped region. As following, a second material layer is formed on the first material layer. Finally, the second material layer, the first material layer and the substrate at the two sides of the gate structure are etched sequentially, and a recess is formed in the substrate, at the two sides of the gate structure, wherein the recess is positioned within the first doped region.

20 Claims, 6 Drawing Sheets

FABRICATION METHOD OF SEMICONDUCTOR STRUCTURE

BACKGROUND OF THE INVENTION

1. Field of the Invention

The present invention relates to a fabrication method of a semiconductor structure, and more particularly, to a fabrication method of a semiconductor structure using the boron doped region to limit the forming area of the recess.

2. Description of the Prior Art

For the sake of increasing the carrier mobility of the semiconductor structure, a compressive stress or tensile stress can be optionally applied to the gate channel. In conventional arts, a selective epitaxial growth (SEG) process is used to form a compressive stress. For example, after the formation of a gate on a silicon substrate, a silicon-germanium (SiGe) epitaxial structure is formed in the predetermined location, in which the lattice arrangement of silicon (Si) and germanium (Ge) are similar to each other. Since the lattice constant of the SiGe layer is larger than a lattice constant of Si, accordingly, the band structure of Si may be changed, and the compressive stress is then formed and applied to the channel region of a PMOS transistor, thereby increasing the carrier mobility in the channel region, as well as increasing the efficiency of the PMOS transistor. On the other hand, a silicon carbide (SiC) epitaxial structure can be optionally formed in the silicon substrate of a NMOS transistor, to apply the tensile stress to the channel region of the NMOS transistor.

While the foregoing method can improve the carrier mobility in the channel region, said method also has led to the difficulty of the overall fabrication process and the process control, especially under the trend of miniaturization of semiconductor device dimensions. For example, conventional arts usually define a recess region in the silicon substrate, and further form the SiGe epitaxial structure in the recess region. However, when the semiconductor device is increasingly miniaturized, it can fail to precisely define the forming position of the recess region. Thus, it is easy to cause some drawbacks, such as damages to the light doped drain (LDD) region leading to short channel effect, resulting in increased leakage current, such that, the quality, and the efficiency of the components will be dramatically affected.

Hence, there is a need of proving a novel fabrication method of a semiconductor structure, to obtain more reliable semiconductor device.

SUMMARY OF THE INVENTION

The present invention provides a novel fabrication method of a semiconductor structure, which can precisely define the forming position of the recess, thereby forming more reliable semiconductor devices.

It is one of the objectives of the present invention to provide a fabrication method of a semiconductor structure. First of all, a gate structure is formed on a substrate, and a first material layer is formed on the substrate and the gate structure. Next, boron is implanted into the substrate at two sides of the gate structure, to form a first doped region, and P type conductive dopant is implanted into the substrate at the two sides of the gate structure to form a second doped region. After that, a second material layer is formed on the first material layer, and the second material layer, the first material and the substrate are etched sequentially, and then a recess is formed in the substrate at the two sides of the gate structure, wherein the recess is positioned within the first doped region.

It is another one of the objectives of the present invention to provide a fabrication method of a semiconductor structure. First of all, a gate structure is formed on a substrate, and a boron doped region is formed in the substrate at two sides of the gate structure. After that, the substrate is etched to form a recess in the substrate at the two sides of the gate structure, wherein an area of the recess does not extend over an area of the boron doped region.

The fabrication method of the semiconductor structure according to the present invention mainly forms a boron doped region in the substrate at the two sides of the gate structure, with the boron doped region reducing the etching rate of the isotropically etching process, and forms the first material layer and the second material layer respectively to define the position of the boron doped region and the recess region. Therefore, through the fabrication method of the present invention, the positions of the light doped region and the recess region can be defined precisely, to keep from the short channel effect influencing the reliability of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved. Please note that the figures are only for illustration, and detailed description therein is not to be taken in a limiting sense. Modifications of the method of the present invention are also possible, and the method detailed therein may also be performed to form an alternative structure based on the present embodiment.

Figure 1:
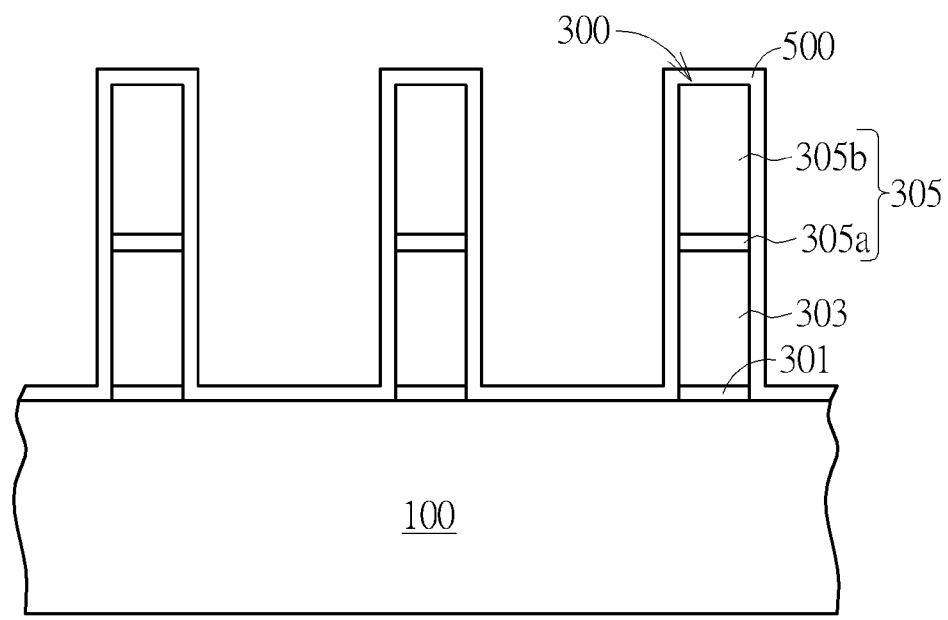
FIG. 1 to FIG. 7 are schematic diagrams illustrating a fabricating method of a semiconductor structure in accordance with a first embodiment of the present invention.

Referring to FIG. 1 to FIG. 7, FIG. 1 to FIG. 7 are schematic diagrams illustrating a fabricating method of a semiconductor structure in accordance with a first embodiment of the present invention. As shown in FIG. 1, a gate structure 300 is formed on a substrate 100, and a first material layer 500 is entirely formed on the substrate 100 and the gate structure 300. In the present embodiment, the gate structure 300 includes a dielectric layer 301, a gate electrode 303 and a capping layer 305, and the aforementioned dielectric layer 301, the gate electrode 303 and the capping layer 305 can be fabricated through a same lithography process. Wherein, the method of forming the gate structure 300 may include the following steps, for example entirely forming a dielectric material layer, a gate material layer and a capping material layer (not shown in the drawings) firstly and patterning those stacked material layers to form the gate structure 300. However, the method of forming the gate structure 300 of the present invention is not limited to the aforementioned steps and which may also be formed through other processes. The first material layer 500 covers the gate structure 300. In the present embodiment, the first material layer 500 may include silicon nitride (SiN) or silicon carbonitride (SiCN) and a thickness thereof is substantially between 30 angstroms to 40 angstroms, but not limited thereto.

In one embodiment, the substrate 100 can be for example a silicon substrate, an epitaxial silicon substrate, a silicon carbide substrate or a silicon-on-insulator (SOI) substrate, but not limited thereto. The dielectric layer 301 can include silicon dioxide ($SiO_2$), SiN, or high dielectric constant (high-K) material; the gate electrode 303 can include metal, polysilicon, silicide or other conductive materials; and the capping layer 303 includes $SiO_2$, SiN, silicon carbide (SiC) or silicon oxycarbide (SiON), but not limited thereto. Also, in one embodiment, the capping layer 305 can further include a first capping layer 305a and a second capping layer 305b, for example including $SiO_n$ and SiN respectively.

Furthermore, in one embodiment, a plurality of doped wells (not shown in the drawings) or a plurality of shallow trench isolations (STI) used for electrically isolation can be previously formed in the substrate 100. Also, in another variant embodiment, the fabrication method of the semiconductor structure of the present invention can also be applied to a non-planar transistor, such as fin field-effect transistor (fin-FET), such that the element 100 shown in FIG. 1 will refer to a fin structure formed on a substrate accordingly.

Figure 2:
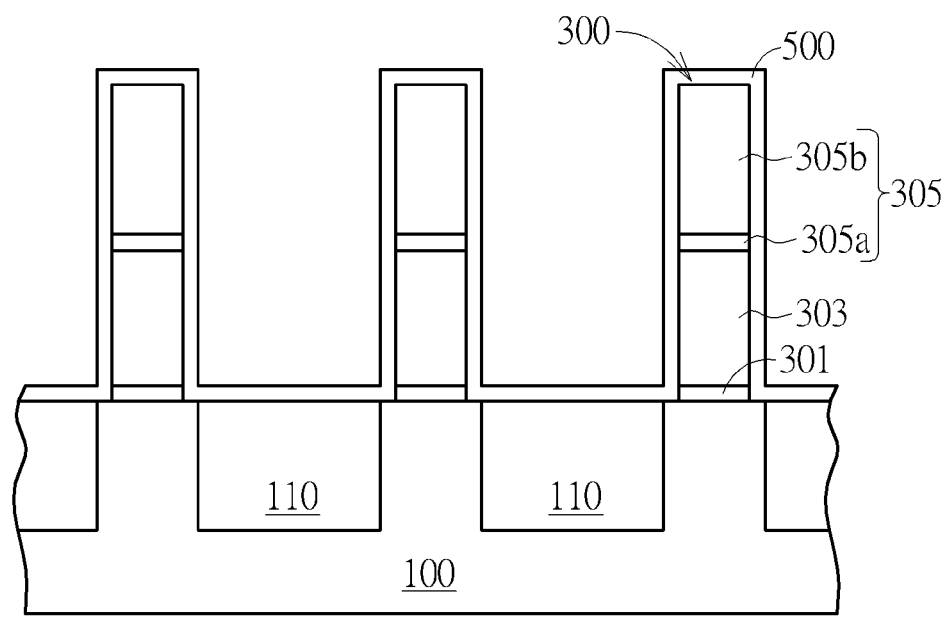

As shown in FIG. 2, a first ion implantation process is performed, to implant a dopant which is adapted to reduce the etching rate, such as boron, to the substrate 100 at two sides of the gate structure 300, and to form a first doped region 110. Precisely speaking, the first ion implantation process uses the gate structure 300 and a portion of the first material layer 500 covered on the side wall of the gate structure 300 as an ion implantation mask, such that the first doped region 110 having a side edge vertically aligned with the first material layer 500 in a vertical direction is formed accordingly. In a preferred embodiment of the present invention, boron is selected to be used in the ion implantation process, and the dosage of the boron is substantially between 1.5E13 and 1.5E15, (atoms/$cm^2$), and the doped emerge is substantially between 4 kiloelectron volt (KeV) and 12 KeV, but not limited thereto. In other words, the first doped region 110 is boron doped region, but not limited thereto.

Figure 3:
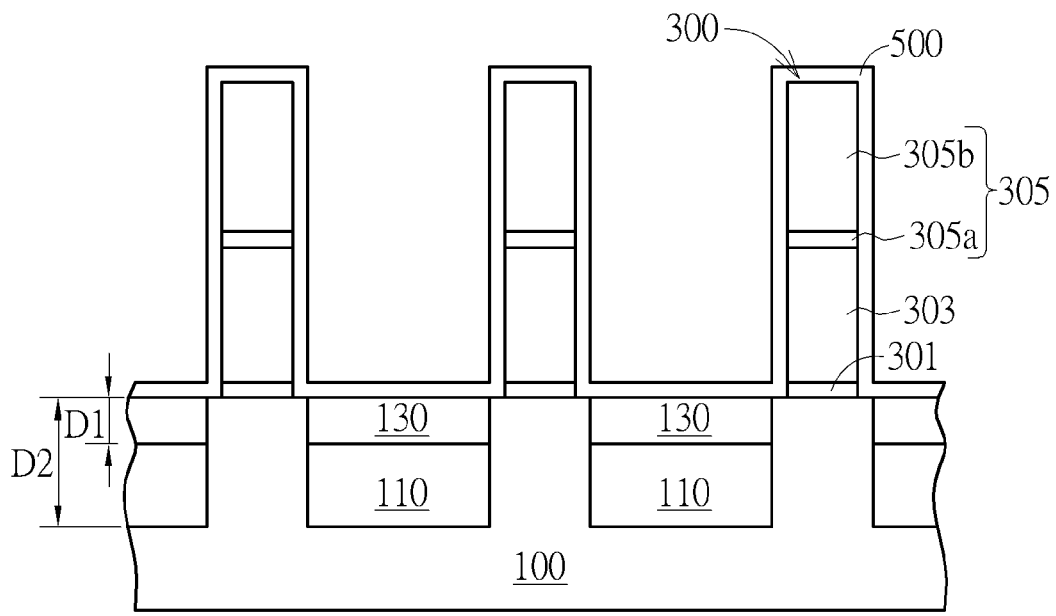

Next, as shown in FIG. 3, a second ion implantation process is performed, to implant a conductive dopant which is necessary to a semiconductor device, to the substrate 100 at the two sides of the gate structure 300, and to form a second doped region 130, with the second doped region 130 performing like a light doped drain (LDD) region or a source/drain extension (SDE) region. Wherein, similar to the first ion implantation process, the second ion implantation process also uses the gate structure 300 and the vertical portion of the first material layer 500 as an ion implantation mask, such that the second doped region 130 includes a side edge being vertically aligned with the first material layer 500 in a vertical direction, as shown in FIG. 3. In a preferred embodiment of the present invention, a fabricating method of a PMOS is exemplified, so that P type conductive dopant is selected to be used in the second ion implantation process. In other words, the second doped region 130 is P type doped region, but not limited thereto.

It is worth of mentioning that in the present embodiment, the second doped region 130 and the first doped region 110 can be formed by using the same ion implantation mask, such as the gate structure 300 and the non-etched portion of the first material layer 500 covered on the side wall of the gate structure 300, as shown in FIG. 3. Also, a thermal process, such as an anneal process, can be further performed to distribute the implanted dopant into the substrate 100, wherein the thermal process is not limited to be performed at this step. Accordingly, the first doped region 110 overlaps the second doped region 130, and the second doped region 130 and the first doped region 110 have a depth D1, D2 in the substrate 100 respectively, wherein the depth D2 of the first doped region 110 is greater than the depth D1 of the second doped region 130. Furthermore, although the aforementioned embodiment exemplifies performing the first ion implantation process prior than performing the second ion implantation process, the time sequence of present invention is not limited thereto. In another embodiment, the second ion implantation process can also be performed preferentially, followed by performing the first ion implantation process.

Figure 8:
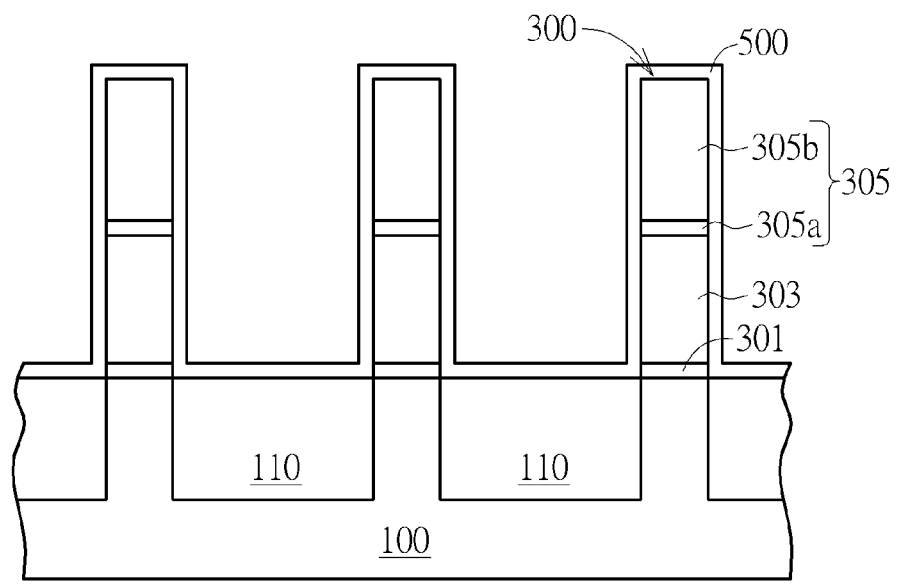
FIG. 8 is a schematic diagram illustrating a fabricating method of a semiconductor structure in accordance with a variant embodiment of the present invention.

Additionally, in another variant embodiment, the first ion implantation process can be also performed before forming the first material layer 500, for example directly using the gate structure 300 as an ion implantation mask and forming a first doped region 110 having a side edge vertically aligned with the gate structure 300, as shown in FIG. 8. Then, the second ion implantation process is then performed after forming the first material layer 500, to form the LDD region.

Figure 4:
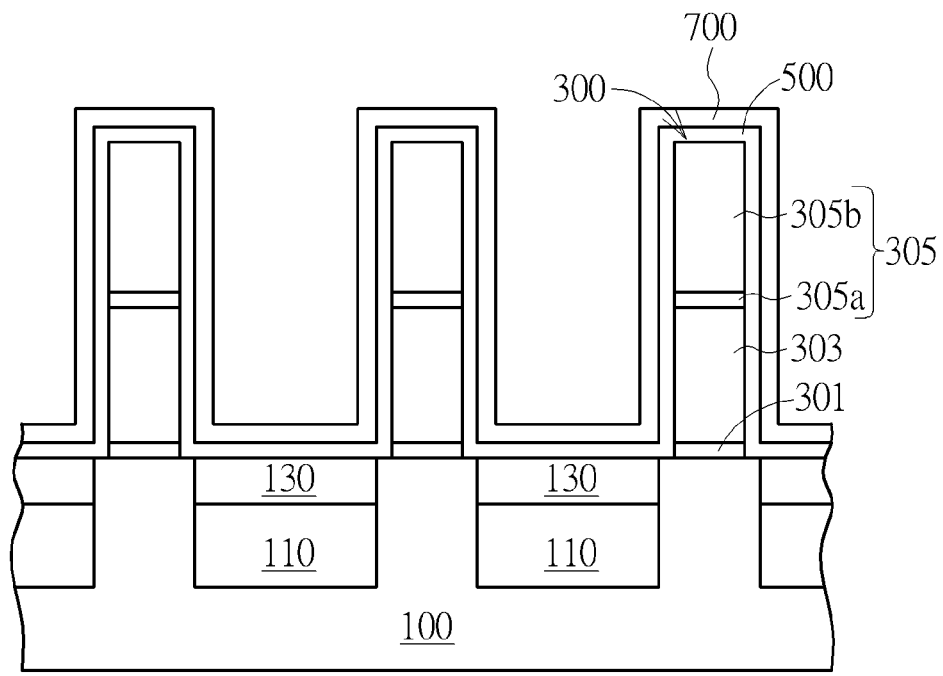

After that, as shown in FIG. 4, a second material layer 700 is entirely formed on the entire first material layer 500, and the second material layer 700 covers the gate structure 300, the first doped region 110 and the second doped region 130. In the present embodiment, the second material layer 700 for example includes a SiN layer or a SiCN layer, and the thickness of the second material layer 700 is substantially greater than 60 angstroms, but not limited thereto. Furthermore, in one embodiment, the second material layer 700 may include the same material as the first material layer 500, for example both of the first material layer 500 and the second material layer 700 include SiN or SiCN, and the total thickness of the first material layer 500 and the second material layer 700 is substantially between 90 to 100 angstroms, but not limited thereto.

Figure 5:
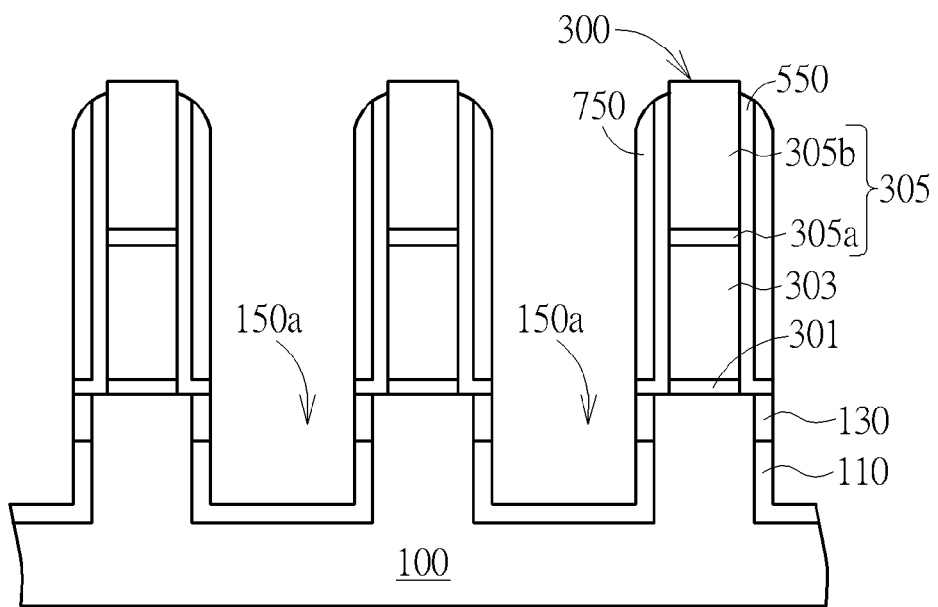
Figure 6:
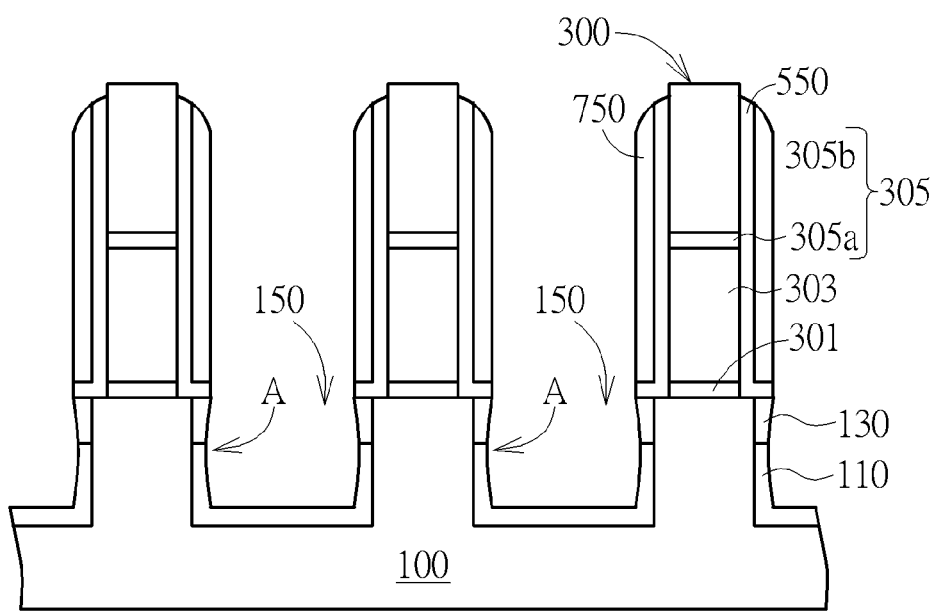

As shown in FIG. 5 and FIG. 6, at least an etching process is performed to etch the second material layer 700, the first material layer 500, the first doped region 110 and the second doped region 130, to form a spacer at the side wall of the gate structure 300, and to form at least one recess in the substrate at the two sides of the gate structure 300. Wherein, the spacer includes a first spacer 550 made from the first material layer 500 and a second spacer 750 made from the second material layer 700.

It is worth of mentioning that, in the present embodiment, the etching process uses the gate structure 300, the first spacer 550 and the second spacer 750 as a mask to etch the substrate 100 at the two sides of the gate structure 300, such that, the portion of the substrate 100 at the two sides of the gate structure 300 will be partially removed during the etching process. Namely, a portion of the first doped region 110 and a portion of the second doped region 130 are etched, and the etching area will not extend over the area of the first doped region 110, however, with the recess 150 being positioned within the area of the first doped region 110.

Further speaking, in one embodiment, an anisotropically etching, such as a dry etching process, can be performed at first, to remove a portion of the first material layer 500 and a portion of the second material layer 700, thereby forming the L-shaped first spacer 550 and the second spacer 750 and exposing a portion of the gate structure 300. Next, the anisotropically etching, such as a dry etching process is continued, to remove a portion of the first doped region 110 and a portion of the second doped region 130 to form a primary recess 150a completely positioned within the first doped region 110. Wherein, a side edge of the primary recess 150a is vertically aligned with the second spacer 750 in the vertical direction, as shown in FIG. 5.

As following, an isotropically etching or a lateral etching, such as a wet etching process, is then performed, to further laterally etch the side edge of the primary recess 150a isotropically, and to form the recess 150, as shown in FIG. 6. It is noted that since the first doped region 110, especially around the bottom part thereof which usually has a high concentration of the dopant (such as boron), includes the dopant being capable of reducing the etching rate, the rate of the isotropically etching or a lateral etching is relatively slow at this part. On the other hand, since the top part of the first doped region 110 usually has a low concentration of the dopant (such as boron), the rate of the isotropically etching or a lateral etching is relatively fast, so as to form the recess 150 with the side wall being further etched laterally. However, the recess 150 will not be etched along a specific crystal plane, and therefore, the polygon shaped structure (also called sigma Σ), such as diamond shape or hexagonal shaped will not be observed on the recess 150. The recess 150 has a round angle A at the center of the side edge thereof, and the round angle A is positioned underneath the second spacer 750 in the projection direction perpendicular to the gate structure 300. In other words, the recess 150 is positioned within the area of the first doped region 110. In one embodiment of the present invention, the wet etching is performed by using an etchant including ammonium hydroxide ($NH_4OH$) or tetramethylammonium hydroxide (TMAH), and the method of forming the recess according to the present invention is not limited to the aforementioned dry etching accompanied with wet etching, and the recess may also be formed through other processes.

Figure 7:
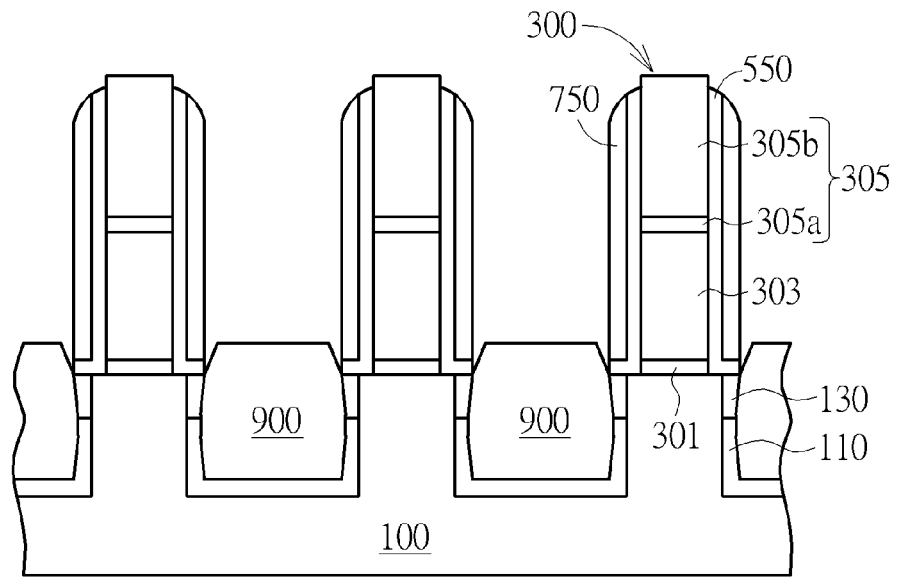

After that, as shown in FIG. 7, a selective epitaxial growth (SEG) process is performed to form an epitaxial structure 900 in the recess 150. Precisely speaking, a cleaning process can be additionally performed after the etching process, to remove the impurities and the residues of etching, and then the selective epitaxial growth process is performed to form the epitaxial structure 900 in the recess 150. In the present embodiment, the epitaxial structure 900 is positioned within the area of the first doped region 110, and is extended upwardly from the bottom of the recess 150 till over a surface of the substrate 100. Please note that, the recess confines the selective forming of the epitaxial structure 900, such that the epitaxial structure 900 will be formed conformally to form a round angle, based on the area of the recess 150. The epitaxial structure 900 extends underneath the second spacer 750 in a horizontal direction, such that a side edge of the epitaxial structure 900 will be positioned underneath the second spacer 750 in a projection direction which is vertical to the gate structure 300. In other words, the epitaxial structure 900 is also positioned in the area of the first doped region 110. In the present invention, the epitaxial structure 900 may include various materials in accordance with different requirements, for example, the epitaxial structure 900 may include silicon germanium (SiGe) in the present embodiment, but not limited thereto. Furthermore, the epitaxial structure 900 can also be doped in-situ with P type conductive dopants to form a $P^+$ SiGe epitaxial structure as a source/drain region thereby. Therefore, the additional ion implantation process for forming the source/drain region can be omitted accordingly. Also, in other embodiments, the epitaxial structure 900 may include single layered structure or multilayered structure, and the dosage of Ge dopant and/or P type conductive dopant may be optionally increased in a gradient, but not limited thereto.

Through the aforementioned embodiments, it is noted that the fabrication method of the semiconductor structure according to the present invention mainly forms the boron doped region in the substrate at the two sides of the gate structure, with the boron doped region to reduce the isotropically etching rate, to keep from over etching the substrate and to precisely control the position of the recess. On the other hand, the fabrication method of the present invention uses un-etched first material layer, and etched first material layer and etched second material layer to define the boron doped region and the recess region respectively, such that the forming position of the recess region can be precisely defined within the boron doped region. Therefore, through the present invention, it is sufficient to avoid the damages to the light doped drain region which is also defined by the un-etched first material layer, so as to keep from the short channel effect influencing the reliability of the semiconductor device.

The following description will detail other different embodiments or variant embodiments of the fabricating method of the semiconductor structure of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
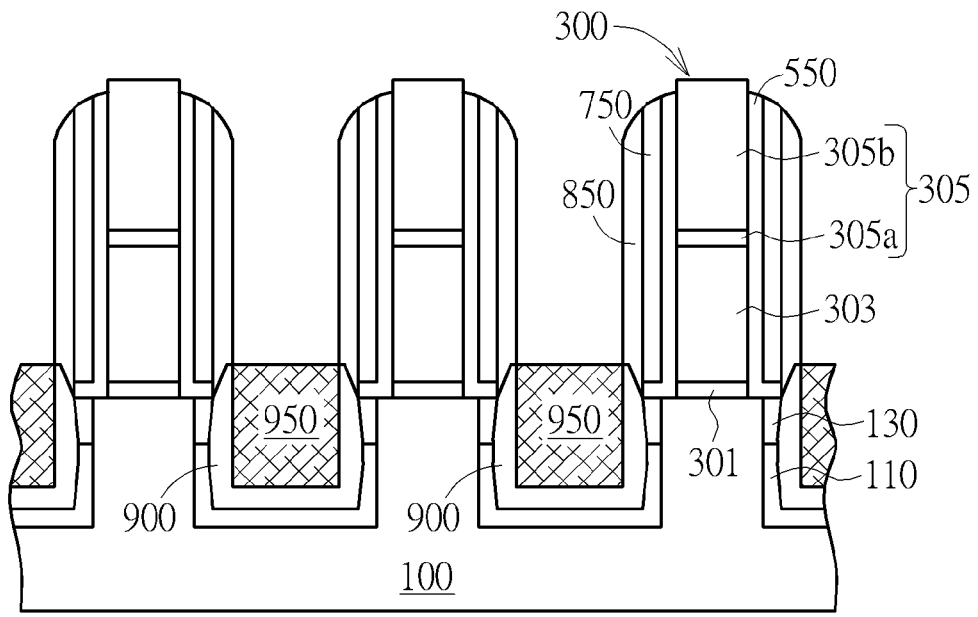
FIG. 9 is a schematic diagram illustrating a fabricating method of a semiconductor structure in accordance with a second embodiment of the present invention.

FIG. 9 is a schematic diagram illustrating a fabricating method of a semiconductor structure in accordance with a second embodiment of the present invention. The formal steps in the second embodiment are similar to those as in FIG. 1 to FIG. 7 in the first embodiment and are not repeatedly described. After forming the epitaxial structure 900 as shown in FIG. 7, please refer to FIG. 9, where an additional ion implantation process for forming the source/drain region is performed to implant a suitable dopant, such as P type conductive dopant, in the epitaxial structure 900 at the two sides of the gate structure 300 and to form a source/drain region 950, as shown in FIG. 9. Wherein, the method of forming source/drain region 950 may include the following steps. Firstly, a third material layer (not shown in the drawings) is formed on the side wall of the gate structure 300, the third material layer uniformly covers the substrate, the gate structure 300 and the epitaxial structure 900, and partially covers the capping layer 305. Next, a suitable etching process is performed to etch the third material layer and to form the third spacer 805, wherein the third spacer 850 partially covers the epitaxial structure 900. After that, the source/drain region 950 is then formed in the epitaxial structure 900 at the two sides of the gate structure 300 by using the gate structure 300, the first spacer 550, the second spacer 750 and the third spacer 850 as a mask. The third material may optionally include the same material or different material to the first material layer 500 and the second material layer 700, such as SiN, $SiO_n$, SiCN or a composition of the aforementioned materials.

Figure 10:
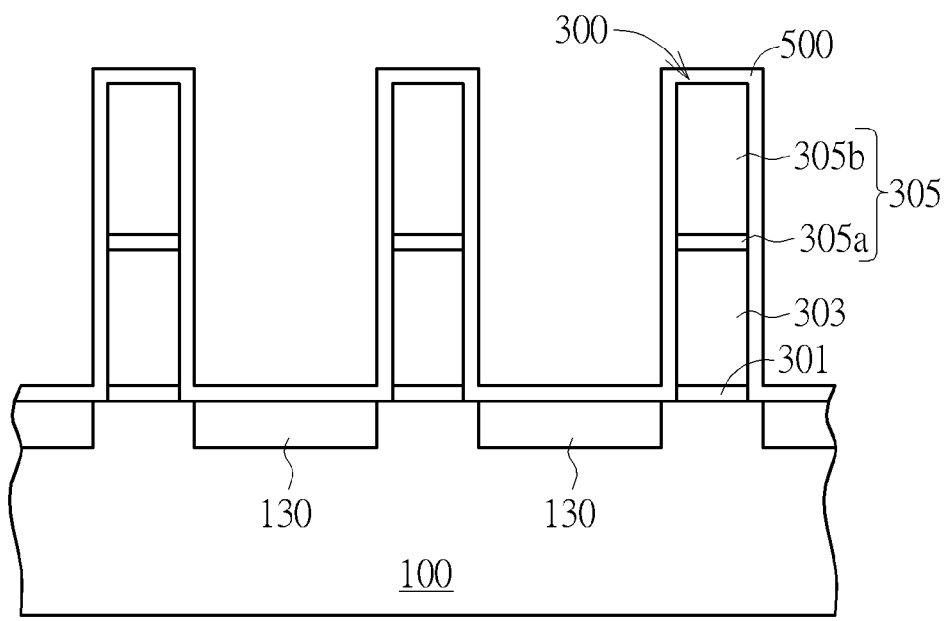
FIG. 10 to FIG. 11 are schematic diagrams illustrating a fabricating method of a semiconductor structure in accordance with a third embodiment of the present invention.
Figure 11:
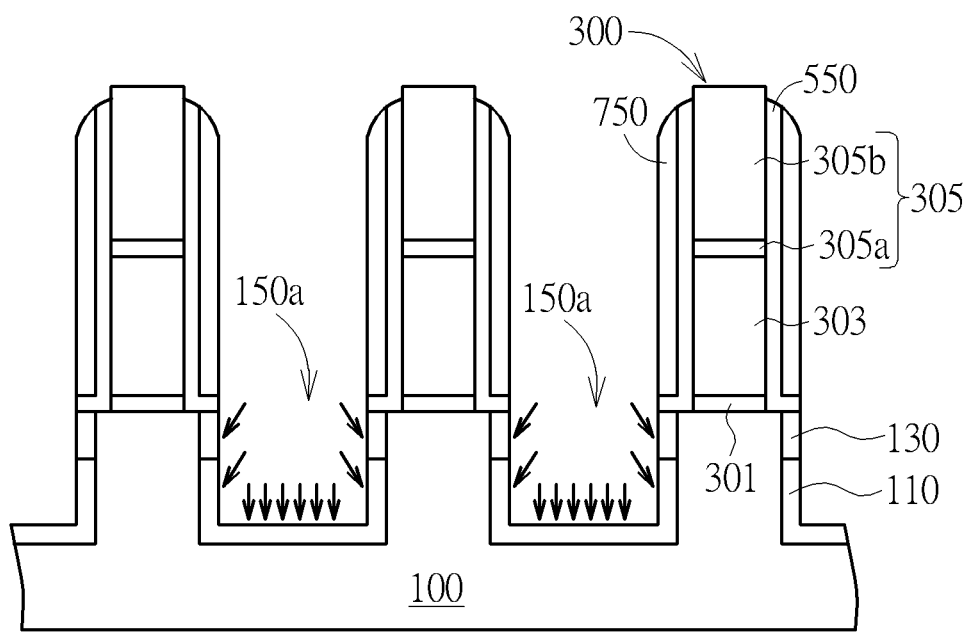

FIG. 10 to FIG. 11 are schematic diagrams illustrating a fabricating method of a semiconductor structure in accordance with a third embodiment of the present invention. The difference between the present embodiment and the aforementioned embodiments is mainly in the time sequence of performing the first ion implantation process. In other words, the dopant for reducing the etching rate is implanted after performing the anisotropically etching and before performing the isotropically etching in the present embodiment. First of all, after forming the semiconductor structure as shown in FIG. 1, please refer to FIG. 10, where the second ion implantation process is performed, to implant a conductive dopant, such as P type conductive dopant into the substrate 100 at the two sides of the gate structure 300, and to form the second doped region 130 as a LDD region, wherein the second doped region 130 has a side edge being vertically aligned with the first material layer 500. Then, similar to what is shown in FIG. 4 and FIG. 5, the second material layer 700, the first material layer 500, the second doped region 130, and the substrate are etched to form the first spacer 550 and the second spacer 750 at the side wall of the gate structure 300, and the primary recess 150a in the substrate 100 at the two sides of the gate structure 300. After that, the first ion implantation process is performed to implant boron into an inner peripheral wall of the primary recess 150a, and to form a first doped region 110 surrounding the primary recess 150a, as shown in FIG. 11. Finally, similar to what is shown in FIG. 6, the primary recess 150a is further etched to form the recess 150.

In other words, the boron implantation of the present embodiment is performed after forming the primary recess 150a, by controlling the implantation angle, such as in a perpendicular angle or an oblique angle, so as to form the first doped region 110 at the bottom and side wall of the primary recess 150a. Preferably, the bottom of the primary recess 150a has a high concentration of dopant, and the side wall of the primary recess 150a has a low concentration of dopant, to reduce the etching rate of the wet etching around the bottom of the primary recess 150a. Except for the aforementioned differences, the conditions of the P type conductive dopant implantation and boron implantation, as well as the wet etching are all the same as the aforementioned first embodiment, and will not be further detail herein.

Although the aforementioned embodiments are based on planar transistors, the people skilled in the art will appreciate the present invention can also be applied to other non-planar transistors, such as fin field effect transistors (Fin FET), which should retain the teachings of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabrication method of a semiconductor structure, comprising:
    forming a gate structure on a substrate;
    forming a first material layer on the substrate and the gate structure;
    implanting boron into the substrate at two sides of the gate structure, to form a first doped region;
    implanting P type conductive dopant into the substrate at the two sides of the gate structure, to form a second doped region;
    forming a second material layer on the first material layer; and
    performing an etching process, etching the second material layer, the first material layer and the substrate respectively, and forming a recess in the substrate at the two sides of the gate structure, wherein the recess is positioned within the first doped region and has a depth smaller than a depth of the first doped region.

2. The fabrication method of the semiconductor structure according to claim 1, wherein the recess comprises a round angle at a side thereof, and the round angle is positioned underneath the second material layer.

3. The fabrication method of the semiconductor structure according to claim 1, wherein the etching process further comprises:
    anisotropically etching the second material layer and the first material layer, to form a spacer;
    anisotropically etching the substrate, to form a primary recess in the substrate at the two sides of the gate structure, wherein a side edge of the primary recess is vertically aligned with the spacer; and
    isotropically etching the side edge of the primary recess, to form the recess.

4. The fabrication method of the semiconductor structure according to claim 3, wherein the step of implanting boron is performed after the step of anisotropically etching the substrate.

5. The fabrication method of the semiconductor structure according to claim 1, wherein the depth of the first doped region is greater than a depth of the second doped region.

6. The fabrication method of the semiconductor structure according to claim 1, wherein the first doped region overlaps the second doped region.

7. The fabrication method of the semiconductor structure according to claim 1, wherein the step of implanting boron comprises using the gate structure and the first material layer as an implantation mask, such that a side edge of the first doped region is vertically aligned with the first material layer.

8. The fabrication method of the semiconductor structure according to claim 1, wherein the step of implanting boron comprises using the gate structure as an implantation mask, such that a side edge of the first doped region is vertically aligned with a side wall of the gate structure.

9. The fabrication method of the semiconductor structure according to claim 1, further comprising:
    forming an epitaxial structure in the recess, the epitaxial structure being positioned within the first doped region.

10. The fabrication method of the semiconductor structure according to claim 9, further comprising:
    forming a source/drain region in the substrate at the two sides of the gate structure.

11. The fabrication method of the semiconductor structure according to claim 10, wherein the source/drain region is in situ formed in the epitaxial structure.

12. The fabrication method of the semiconductor structure according to claim 10, further comprising:
    forming a third spacer, wherein the third spacer is disposed on a side wall of the gate structure and partially covers the epitaxial structure; and
    using the third spacer as an implantation mask to form the source/drain region.

13. A fabrication method of a semiconductor structure, comprising:
    forming a gate structure on a substrate;
    forming a boron doped region in the substrate at two sides of the gate structure; and
    etching the substrate, and forming a recess in the substrate at the two sides of the gate structure, wherein the recess is surrounded by the boron doped region and an area of the recess does not extend over an area of the boron doped region.

14. The fabrication method of the semiconductor structure according to claim 13, wherein the boron doped region is formed before the step of etching the substrate, and the recess is positioned within the boron doped region.

15. The fabrication method of the semiconductor structure according to claim 13, wherein the step of etching the substrate comprises:

performing an anisotropically etching, etching the substrate at the two sides of the gate structure, to form a primary recess; and performing an isotropically etching, etching the primary recess, to form the recess.

16. The fabrication method of the semiconductor structure according to claim 15, further comprising:

forming a first material layer entirely on the substrate and the gate structure; and forming a second material layer entirely on the first material layer; and performing the anisotropically etching, etching the second material layer and the first material layer sequentially, to form a second spacer and a first spacer.

17. The fabrication method of the semiconductor structure according to claim 16, wherein, the boron doped region is formed after the step of forming the first material layer and before the step of forming the second material layer, with a side edge of the boron doped region being vertically aligned with the first material layer in a vertical direction, and the primary recess is formed after the step of forming the second spacer, with a side edge of the primary recess being vertically aligned with the second spacer.

18. The fabrication method of the semiconductor structure according to claim 16, wherein the boron doped region is formed after the step of forming the primary recess, and a side edge of the primary recess is vertically aligned with the second spacer.

19. The fabrication method of the semiconductor structure according to claim 13, further comprising:

forming a P type conductive doped region in the substrate at the two sides of the gate structure, wherein the P type conductive doped region overlaps the boron doped region, and a depth of the boron doped region is greater than a depth of the P type conductive doped region.

20. The fabrication method of the semiconductor structure according to claim 13, further comprising:

performing a selective epitaxial growing in the recess, to form an epitaxial structure; and forming a source/drain region in the epitaxial structure.

* * * * *